United States Patent

Miyashita et al.

[11] Patent Number: 6,069,083
[45] Date of Patent: *May 30, 2000

[54] POLISHING METHOD, SEMICONDUCTOR DEVICE FABRICATION METHOD, AND SEMICONDUCTOR FABRICATION APPARATUS

[75] Inventors: Naoto Miyashita; Masahiro Abe; Mariko Shimomura, all of Yokohama, Japan

[73] Assignee: Kabushiki Kaisha Toshiba, Kawasaki, Japan

[ * ] Notice: This patent is subject to a terminal disclaimer.

[21] Appl. No.: 08/747,518

[22] Filed: Nov. 12, 1996

[30] Foreign Application Priority Data

Nov. 13, 1995 [JP] Japan ................................ 7-317054
Apr. 8, 1996 [JP] Japan ................................ 8-110576

[51] Int. Cl.⁷ .................................................. H01L 21/302
[52] U.S. Cl. ........................... 438/693; 438/970; 216/38; 216/89
[58] Field of Search ................................ 216/38, 88, 89; 438/693, 970

[56] References Cited

U.S. PATENT DOCUMENTS

| | | | |
|---|---|---|---|
| 4,690,693 | 9/1987 | Dobbs et al. | 51/307 |
| 4,954,142 | 9/1990 | Carr et al. | 51/309 |
| 5,032,203 | 7/1991 | Doy et al. | 156/345 |
| 5,084,071 | 1/1992 | Nenadic et al. | 51/309 |
| 5,213,591 | 5/1993 | Celikkaya et al. | 51/293 |
| 5,246,884 | 9/1993 | Jaso et al. | 438/693 |
| 5,352,254 | 10/1994 | Celikkaya | 51/295 |
| 5,354,490 | 10/1994 | Yu et al. | 252/79.1 |
| 5,376,222 | 12/1994 | Miyajima et al. | 156/636 |
| 5,603,739 | 2/1997 | Neuland | 51/298 |
| 5,607,718 | 3/1997 | Sasaki et al. | 216/89 |
| 5,643,837 | 7/1997 | Hayashi | 216/38 |
| 5,721,172 | 2/1998 | Jang et al. | 216/88 |
| 5,733,819 | 3/1998 | Kodama et al. | 438/692 |
| 5,738,800 | 4/1998 | Hosali et al. | 216/99 |
| 5,759,917 | 6/1998 | Grover et al. | 438/692 |

FOREIGN PATENT DOCUMENTS

| | | |
|---|---|---|
| 0 284 840 | 10/1988 | European Pat. Off. . |
| 2-109332 | 4/1990 | Japan . |
| 7-509512 | 10/1995 | Japan . |
| 2247892 | 3/1992 | United Kingdom . |

OTHER PUBLICATIONS

Abstract of Japan Patent Application Kokai Publication No. 61–271376, *Patent Abstracts of Japan*, vol. 011, No. 136 (C–419), Apr. 30, 1987.

*Primary Examiner*—Randy Gulakowski
*Assistant Examiner*—Anita Alanko
*Attorney, Agent, or Firm*—Finnegan, Henderson, Farabow, Garrett & Dunner, L.L.P.

[57] ABSTRACT

Chemical mechanical polisher is disclosed. A polishing slurry stored in a polishing slurry tank, used in this polishing contains a solvent and polishing particles dispersed in the solvent. The polishing particles are selected from silicon nitride, silicon carbide, and graphite. The material to be polished is polished by using a polishing slurry containing silicon nitride particles until a silicon nitride etch stop layer is reached.

7 Claims, 10 Drawing Sheets

| POLISHING PARTICLES | POLISHING RATE (nm/min) | SELECTION RATE (SiO₂/Si₃N₄) | PLANARITY (%) |
|---|---|---|---|
| (I) CeO | 500 ~ 800 | 1 ~ 3 | 15 ~ 20 |
| (II) Fumed SiO₂ | 100 ~ 110 | 2 ~ 3 | 15 ~ 20 |
| (III) Al₂O₃ | 150 ~ 200 | 1 | 10 |
| (IV) Si₃N₄ | 700 ~ 1000 | 10 ~ 20 | 2 ~ 5 |

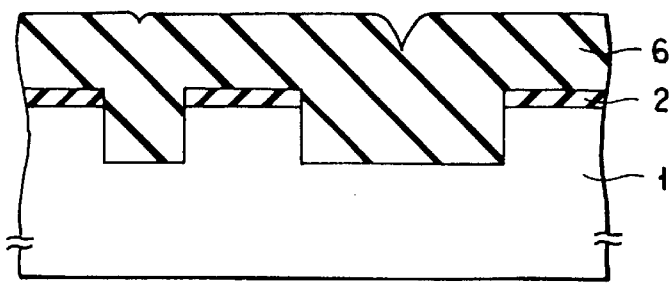
FIG. 3F
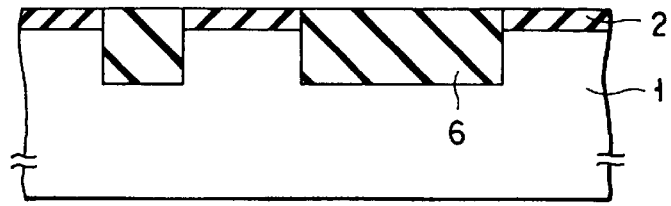
FIG. 3G
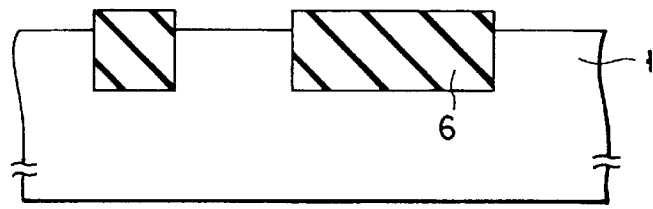
FIG. 3H
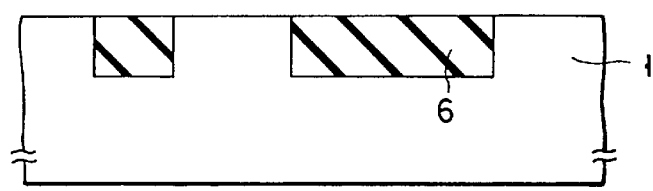
FIG. 3I
| POLISHING PARTICLES | POLISING RATE (nm/min) | SELECTION RATE ($SiO_2/Si_3N_4$) | PLANARITY (%) |
|---|---|---|---|
| (I) CeO | 500 ~ 800 | 1 ~ 3 | 15 ~ 20 |
| (II) Fumed $SiO_2$ | 100 ~ 110 | 2 ~ 3 | 15 ~ 20 |
| (III) $Al_2O_3$ | 150 ~ 200 | 1 | 10 |
| (IV) $Si_3N_4$ | 700 ~ 1000 | 10 ~ 20 | 2 ~ 5 |
FIG. 4

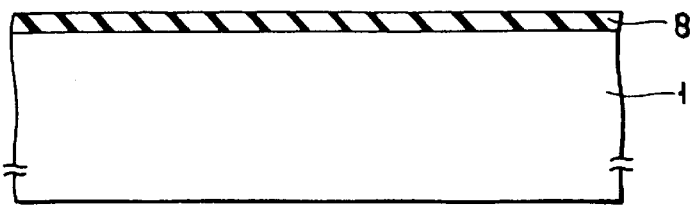
F I G. 5A
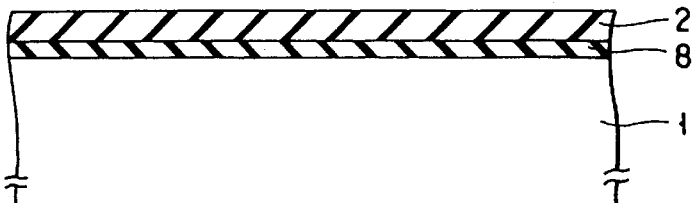
F I G. 5B
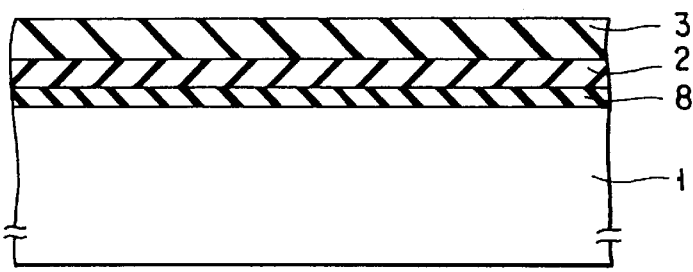
F I G. 5C
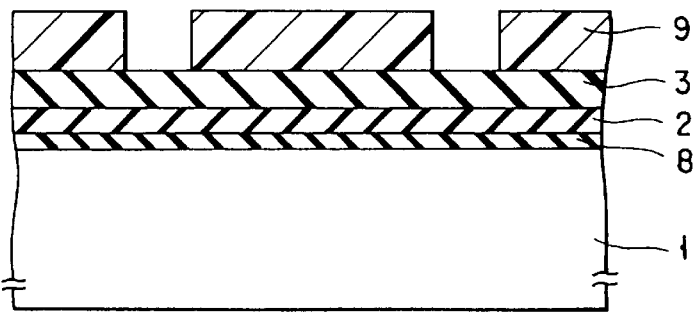
F I G. 5D
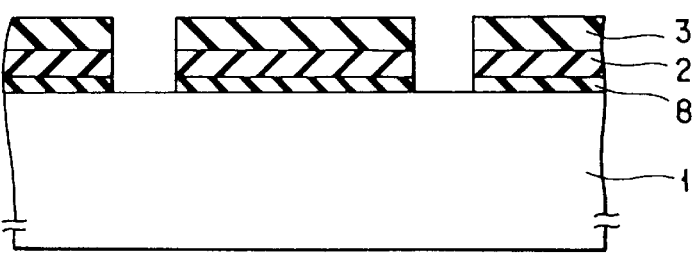
F I G. 5E
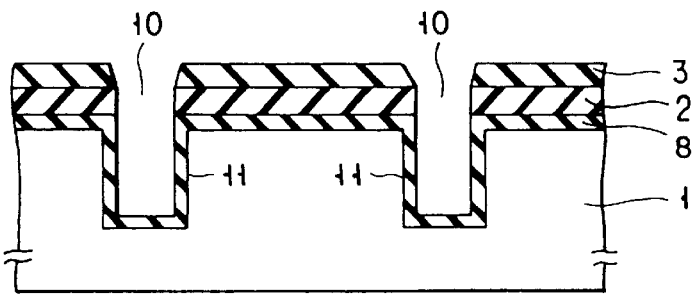
F I G. 5F

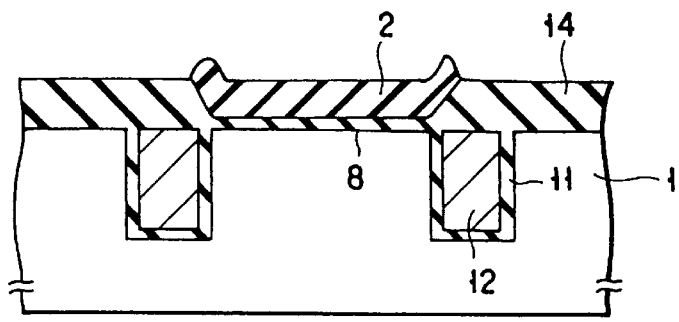
F I G. 5M
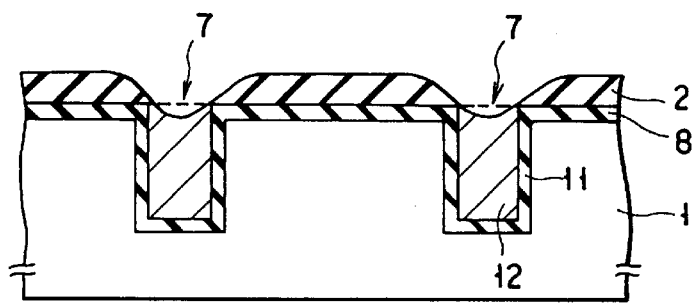
F I G. 6A
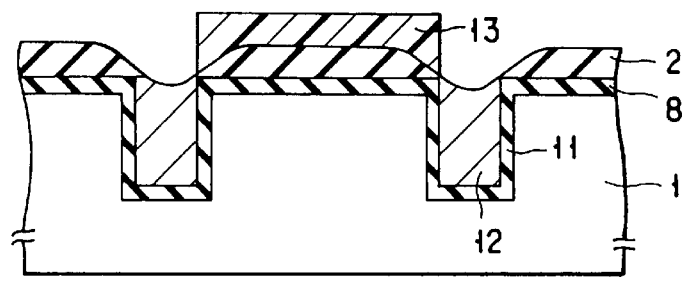
F I G. 6B
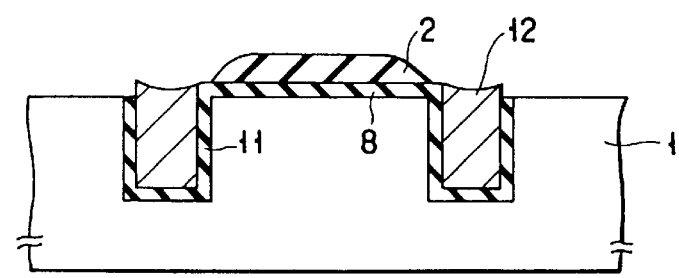
F I G. 6C
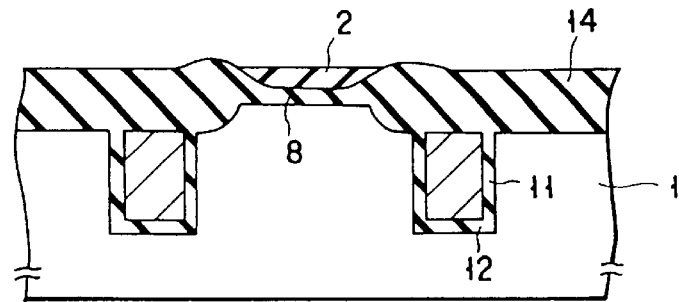
F I G. 6D

POLISHING METHOD, SEMICONDUCTOR DEVICE FABRICATION METHOD, AND SEMICONDUCTOR FABRICATION APPARATUS

BACKGROUND OF THE INVENTION

1. Field of the Invention

The present invention relates to a polishing method, a semiconductor device fabrication method, and a semiconductor fabrication apparatus and, more particularly, to CMP (Chemical Mechanical Polishing).

2. Description of the Related Art

Semiconductor devices such as ICs and LSIs are typically fabricated through the following steps: an integrated circuit designing step of designing integrated circuits; a photomask formation step of forming a photomask used in a lithography step; a wafer manufacturing step of manufacturing wafers having a predetermined thickness from a single-crystal ingot; a wafer processing step of forming a plurality of integrated circuits on each wafer; a dicing step of dicing each of the integrated circuits formed on the wafer into the shape of a semiconductor chip; an assembly step of packaging the diced semiconductor chips; and a testing step of testing the packaged semiconductor chips. Of these steps, the wafer processing step is most important. The wafer processing step is further subdivided into a thin film deposition step of depositing a thin film, a lithography step of exposing/developing a photoresist, an etching step of etching a wafer or the deposited thin film, and an ion implantation step of implanting an impurity ion into the wafer or the deposited thin film. These steps are done by using semiconductor fabrication apparatuses dedicated to the respective steps.

The techniques used in the etching step are roughly classified into two categories.

One is selective etching in which the target surface is masked using a photoresist and only selected portions are etched. This etching is used in the patterning of interconnections and the formation of contact holes.

The other is etch back by which a whole wafer is evenly etched. This etch back is performed to planarize the wafer surface roughened by interconnections or planarize the wafer surface after trenches or recesses are buried with a thin film. As a method of etch back, a method of performing RIE (Reactive Ion Etching) on the wafer surface after recesses on the wafer surface are buried with a photoresist is used most often (this method will be referred to as etch back-RIE hereinafter). Unfortunately, this etch back-RIE has some disadvantages that the method requires a step of coating the target surface with a photoresist, damages easily remain on the wafer surface after etch back, a dangerous etching gas is used in an RIE apparatus, and the global planarization of an entire wafer is rather low due to variations of the etching rate on the wafer surface.

In consideration of these drawbacks, CMP (Chemical Mechanical Polishing) is recently beginning to be studied in place of etch back-RIE.

In CMP, the surface to be polished of a wafer is pressed against a polishing pad adhered to a polishing disc, and the wafer and the polishing disc are rotated while a polishing agent is supplied to the polishing pad, thereby polishing the surface to be polished. The polishing agent used in CMP is a liquid prepared by dispersing polishing particles which mechanically polish the surface to be polished in a polishing solution which chemically etches the surface. This liquid polishing agent has a function of setting the surface to be polished in an active state in which the surface is readily chemically polished, thereby assisting the mechanical polishing by the polishing particles. This liquid polishing agent is called a slurry.

CMP can alleviate some problems of etch back-RIE. However, although CMP can achieve high global planarization, the local planarization obtained by CMP is found to be low in fine portions of a semiconductor device structure. When the wafer surface planarized by using CMP is observed, fine micron-order dish-like recesses called "dishing" are found in fine portions of a semiconductor device structure, particularly in portions made from different substances on the wafer surface.

A typical condition in which "dishing" occurs will be described below with reference to FIGS. 1A to 1D.

FIGS. 1A to 1D are sectional views showing trench isolation steps in order.

FIG. 1A shows the state in which trenches 5 are formed in a silicon substrate 1. A polishing stopper film 2 is formed on the surface of the silicon substrate 1 except the portions in which the trenches 5 are formed. This stopper film 2 is a nitride film ($Si_3N_4$).

Subsequently, as shown in FIG. 1B, silicon dioxide ($SiO_2$) is deposited inside the trenches 5 and on the stopper film 2, forming an oxide film 6. The trenches 5 are buried with the oxide film 6.

In FIG. 1C, CMP is performed for the oxide film 6. As a consequence, the surface of the oxide film 6 dishes to form "dishing" 7.

In FIG. 1D, the stopper film 2 is removed.

In trench isolation in which the "dishing" 7 is formed as shown in FIGS. 1C and 1D, a conductive thin film may remain in the "dishing" 7. If a conductive thin film remains in the "dishing" 7, this film can bring about defective insulation in the future. This influences the reliability of the semiconductor device.

SUMMARY OF THE INVENTION

An important subject is to realize CMP capable of preventing "dishing".

To achieve the above subject, the inventors of this application have focused attention on polishing particles contained in a polishing slurry.

Presently, the polishing particles contained in a polishing slurry are cerium oxide particles or silica particles.

A polishing slurry (to be referred to as a polishing slurry (I) hereinafter) containing cerium oxide particles has a high polishing rate of about 0.5 to 1.0 $\mu$m/min for an oxide film ($SiO_2$) but has a low selection rate ($SiO_2/Si_3N_4$) of about 2 with respect to a nitride film ($Si_3N_4$) as a stopper film. Even if polysilicon (Si) is used as a stopper film, the selection rate ($SiO_2/Si$) is about 1 to 2.

As described above, the polishing slurry (I) has a high polishing rate and a lower selection rate with respect to a stopper film. Accordingly, the polishing slurry (I) readily causes overpolishing and this may scrape off a stopper film and enlarge "dishing".

In contrast, a polishing slurry (to be referred to as a polishing slurry (II) hereinafter) containing silica particles has a polishing rate of about 0.1 to 0.15 $\mu$m/min for an oxide film ($SiO_2$) which is lower than that of the polishing slurry (I). Also, when a stopper film is a nitride film ($Si_3N_4$), the selection rate ($SiO_2/Si_3N_4$) is about 2. Even if polysilicon (Si) is used as a stopper film, the selection rate ($SiO_2/Si$) is about 1.

As described above, even the polishing slurry (II) has a low selection rate with respect to a stopper film and therefore easily causes overpolishing. However, since the polishing rate is lower than that of the polishing slurry (I), the polishing slurry (II) has the advantage that the polishing amount can be easily controlled. By controlling the polishing amount, the amount of overpolishing can be controlled and this decreases "dishing".

The polishing slurry (II) with this advantage can be preferably used in a trial manufacturing process. However, since the polishing rate is too low, the polishing time becomes too long and this makes the slurry (II) not necessarily suitable for a mass-production process.

Furthermore, both of the polishing slurries (I) and (II) have a low selection rate between the stopper film and the film to be polished. This makes a process margin difficult to allow and hence makes these slurries difficult to use in a mass-production process.

For the reasons as explained above, it is presently difficult to use CMP in a mass-production process.

In consideration of the above situation, it is the first object of the present invention to provide a novel polishing slurry and a polishing method using this novel polishing slurry.

It is the second object of the present invention to provide a novel polishing slurry capable of preventing "dishing" and preferable for use in a mass-production process, and a semiconductor device fabrication method using this novel polishing slurry.

It is the third object of the present invention to provide a novel polishing slurry capable of preventing "dishing" and preferable for use in a mass-production process, and a semiconductor fabrication apparatus using this novel polishing slurry.

To achieve the first object, the present invention provides a polishing method of polishing a material to be polished, wherein the material to be polished is polished by using a polishing slurry prepared by dispersing polishing particles consisting of one member selected from the group consisting of silicon nitride, silicon carbide, and graphite.

Since the material to be polished is polished by using a polishing slurry prepared by dispersing polishing particles consisting of any of silicon nitride, silicon carbide, and graphite, various materials to be polished can be polished by a single polishing slurry. For example, it is possible to polish materials constituting semiconductor devices from silicon and silicon oxide to metals such as copper. This polishing method is useful in the fabrication of semiconductor devices. As an example, the number of types of polishing slurries used in the fabrication of semiconductor devices can be decreased, and this prevents the fabrication from being complicated. Furthermore, this polishing method can also polish suicides such as glass and hence can be used in polishing of, e.g., liquid-crystal screens and lenses.

To achieve the second object, the present invention provides a method of planarizing a structure contained in a semiconductor device, comprising the steps of: forming a structure contained in a semiconductor device and a stopper film on a trench formation surface of the structure; etching selected portions of the stopper film and the structure to form a trench in the trench formation surface; forming a burying material on the trench formation surface so that the burying material buries an interior of the trench and covers the trench formation surface; and polishing the burying material until the stopper film is exposed by using a polishing pad and a polishing slurry supplied to the polishing pad and containing polishing particles consisting of one member selected from the group consisting of silicon nitride, silicon carbide, and graphite, thereby burying the trench with the burying material and planarizing the trench formation surface.

A burying material is polished until a stopper film is exposed by using a polishing pad and a polishing slurry supplied to the polishing pad and containing polishing particles consisting of any of silicon nitride, silicon carbide, and graphite. Consequently, the stopper film is not easily scraped off and this prevents "dishing". Accordingly, CMP with high local planarization is possible. Also, since the polishing rate is high, the polishing time can be shortened and this improves the throughput of semiconductor devices. In addition, a high selection rate makes a process margin easy to allow. This is favorable to a mass-production process.

To achieve the third object, the present invention provides a polisher comprising: a polishing disc on which a polishing pad is fixed; a first motor for rotating the polishing disc; a wafer carrier for carrying a material to be polished; a second motor for rotating the wafer carrier; and a polishing slurry supply unit for supplying to the polishing pad a polishing slurry containing polishing particles consisting of one member selected from the group consisting of silicon nitride, silicon carbide, and graphite.

A polisher having a polishing slurry supply unit for supplying to a polishing pad a polishing slurry containing polishing particles consisting of any of silicon nitride, silicon carbide, and graphite is novel. Since this novel polisher supplies to a polishing pad a polishing slurry containing polishing particles consisting of any of silicon nitride, silicon carbide, and graphite, a single polisher can polish materials constituting semiconductor devices, e.g., from silicon and silicon oxide to metals such as copper. This polisher promotes simplification of the fabrication line of semiconductor devices, prevents an increase in the installation cost, and can therefore decrease the fabrication cost of semiconductor devices.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A to 3I are sectional views showing trench isolation steps according to the first embodiment of the present invention;

FIG. 4 is a table showing the results of comparative experiments;

FIGS. 5A to 5M are sectional views showing steps of burying trenches with polysilicon according to the second embodiment of the present invention;

FIGS. 6A to 6D are sectional views showing steps of burying trenches with polysilicon;

DETAILED DESCRIPTION OF THE PREFERRED EMBODIMENTS

Embodiments of the present invention will be described below with reference to the accompanying drawings.

Figure 1A:
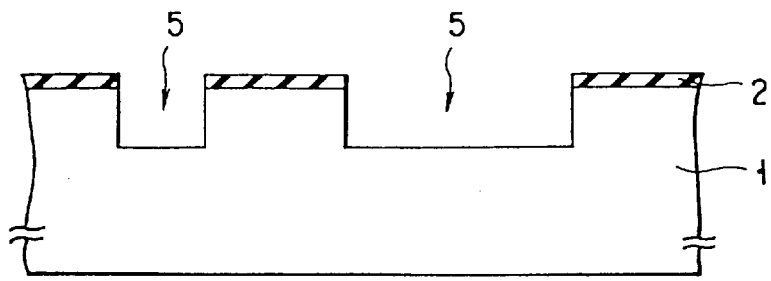
FIGS. 1A to 1D are sectional views showing trench isolation steps.
Figure 1B:
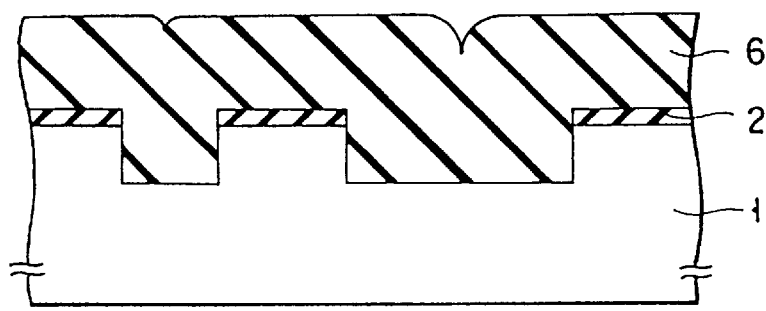
Figure 1C:
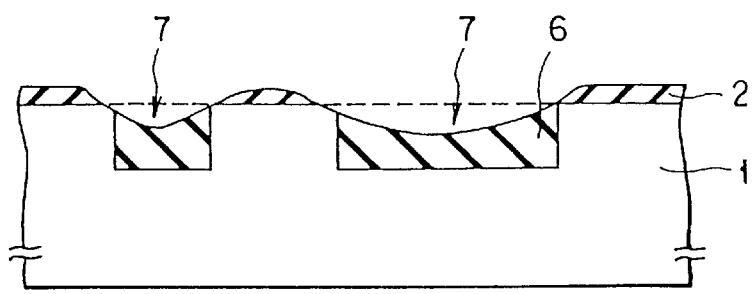
Figure 1D:
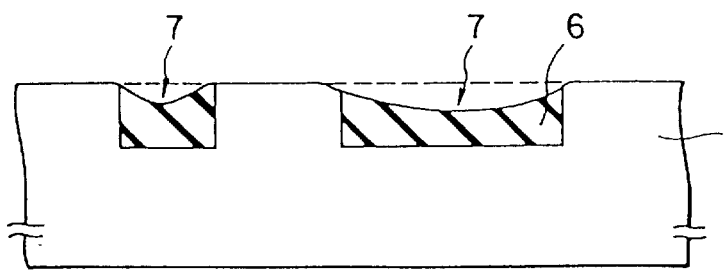
Figure 2:
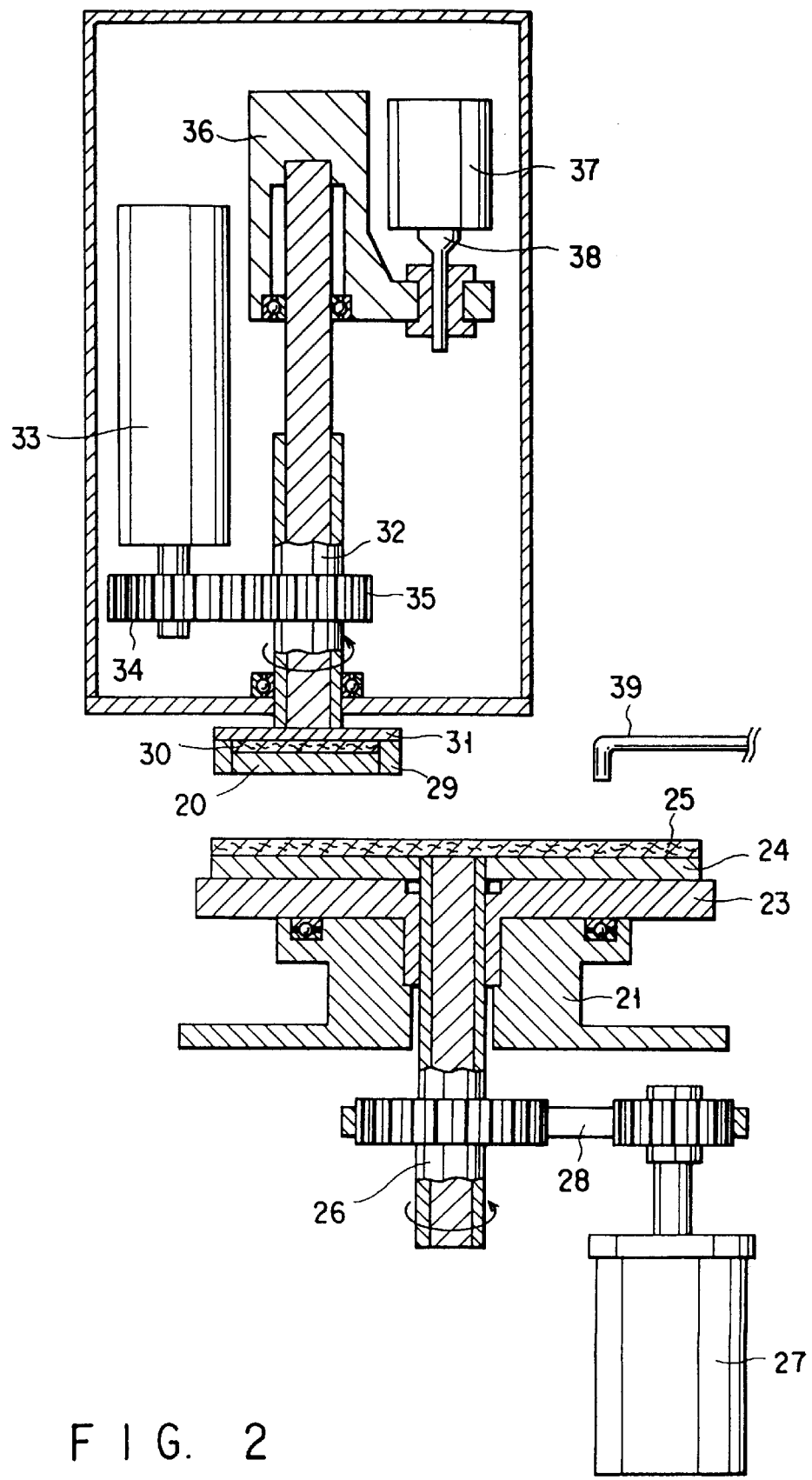
FIG. 2 is a sectional view showing a polishing apparatus used in CMP according to the present invention.

FIG. 2 is a sectional view of a polishing apparatus used in CMP (Chemical Mechanical Polishing) according to the present invention.

As shown in FIG. 2, a polishing disc support 23 is arranged on a stage 21 via a bearing. A polishing disc 24 is attached to the support 23. A polishing pad 25 for polishing a wafer 20 is adhered to the polishing disc 24. A driving shaft 26 for driving the support 23 and the polishing disc 24 is connected to the central portions of the support 23 and the polishing disc 24. The shaft 26 is rotated by the rotation of a rotating belt 28. The rotating belt 28 is rotated by a motor 27.

A wafer carrier 31 is arranged in a position opposite to the polishing pad 25. A retainer ring 29 is attached to the wafer carrier 31. An adsorption pad 30 is attached to a hole formed in the retainer ring 29. The wafer 20 is adsorbed by the adsorption pad 30 by vacuum or water and carried by the wafer carrier 31. The central portion of the wafer carrier 31 is connected to a driving shaft 32 for rotating the carrier 31. The shaft 32 is rotated by a motor 33 via gears 34 and 35. The shaft 32 is attached to a driving base 36 which is attached to a piston 38 of a cylinder 37. The driving base 36 moves vertically when the piston 38 moves vertically.

To polish the wafer 20, the wafer carrier 31 carrying the wafer 20 and the polishing pad 24 are rotated. A polishing slurry is supplied to the polishing pad 25 through a polishing slurry supply nozzle 39. A down force is applied to the wafer carrier 31 by the piston 38, thereby pushing the wafer 20 against the polishing pad 25 by a predetermined pressure. The wafer 20 is polished by maintaining this state for a time required for polishing.

A method of fabricating a semiconductor device using CMP according to the present invention will be described below.

Trench isolation steps will be described first as the first embodiment. Trench isolation is accomplished by burying trenches formed in a wafer (to be referred to as a silicon substrate hereinafter) with a CVD-oxide film (CVD-SiO$_2$) and planarizing the CVD-oxide film by CMP.

FIGS. 3A to 3I are sectional views showing the trench isolation steps in order.

Figure 3A:
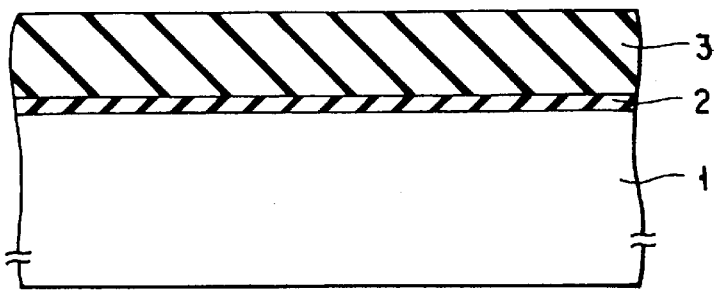

As shown in FIG. 3A, silicon nitride (Si$_3$N$_4$) is deposited on a silicon substrate 1 to form a 70-nm thick nitride film 2. This nitride film 2 serves as a polishing stopper film. Silicon dioxide (SiO$_2$) is deposited on the nitride film 2 to form a CVD-oxide film 3. This CVD-oxide film 3 serves as a mask when trenches are formed.

Figure 3B:
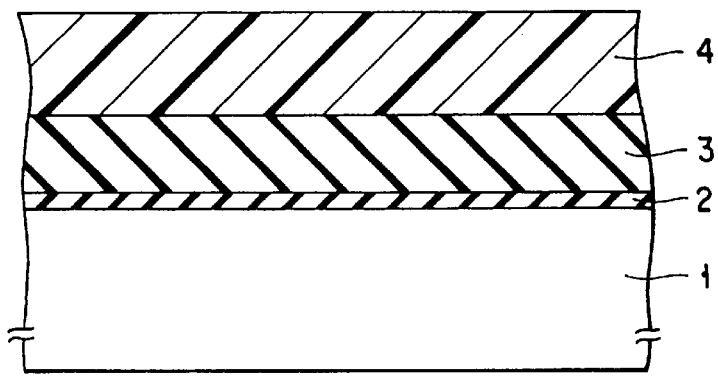

In FIG. 3B, the CVD-oxide film 3 is coated with a photoresist to form a photoresist layer 4.

Figure 3C:
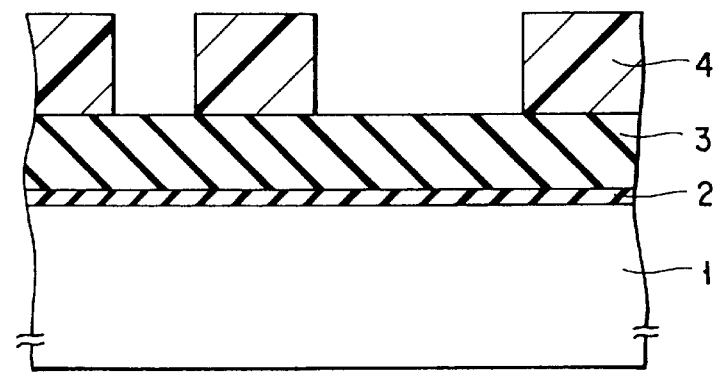

In FIG. 3C, windows corresponding to a trench formation pattern are formed in the photoresist layer 4 by photolithography.

Figure 3D:
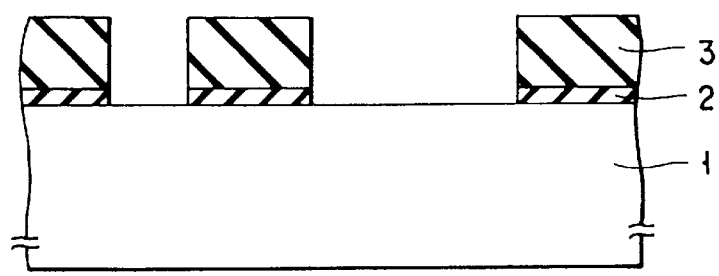

In FIG. 3D, the CVD-oxide film 3 and the nitride film 2 are etched by RIE by using the photoresist layer 4 as a mask. Thereafter, the photoresist layer 4 is removed.

Figure 3E:
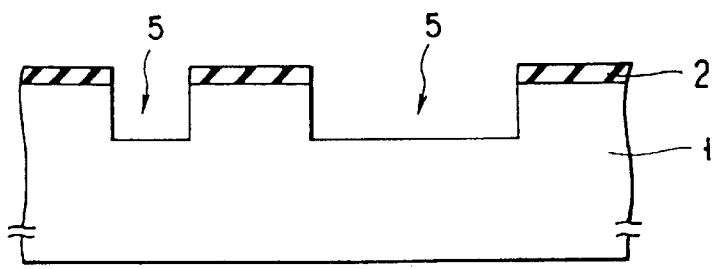

In FIG. 3E, the CVD-oxide film 3 and the silicon substrate 1 are etched by RIE. As a consequence, trenches 5 are formed in the silicon substrate 1 due to the difference between the etching rates of the CVD-oxide film 3 and the silicon substrate 1. Subsequently, a damage layer formed by RIE on the surface in the trenches 5 to which the silicon substrate 1 is exposed and reaction products formed simultaneously with RIE are removed. This is done by wet processing (wet etching).

In FIG. 3F, silicon dioxide (SiO$_2$) is deposited on the structure shown in FIG. 3E to form a CVD-oxide film 6. This CVD-oxide film 6 buries the trenches 5 and at the same time covers the surface of the silicon substrate 1 on which the trenches 5 are formed.

In FIG. 3G, CMP is performed by the polishing apparatus shown in FIG. 2 by using the CVD-oxide film 6 and the nitride film 2 as stopper films, thereby planarizing the surface of the structure shown in FIG. 3F.

In this CMP step, a novel polishing slurry according to the present invention is used. One example of the polishing slurry according to the present invention is prepared by dispersing silicon nitride particles as polishing particles in nitric acid as a solvent. The polishing particles act on the CVD-oxide film 6 and mechanically polish the CVD-oxide film 6. The particle size of the silicon nitride particles themselves, i.e., the particle size of primary particles is preferably 0.01 to 1000 nm. A particle size exceeding 1000 nm is unpreferable because the mechanical polishing properties become too strong and the chemical polishing properties become extremely weak. On the other hand, if the particle size is smaller than 0.01 nm, the mechanical polishing properties become weak to make well-balanced polishing impossible. The particle size of the primary particles is particularly preferably 10 to 40 nm. If the particle size of the primary particles is 10 to 40 nm, well-balanced polishing is possible.

The silicon nitride particles can also be colloidally dispersed in a solvent. When the silicon nitride particles are colloidally dispersed in a solvent, the silicon nitride particles are readily evenly dispersed in the solvent. The particle size of the colloidal silicon nitride particles, i.e., the particle size of secondary particles is preferably 60 to 300 nm, and particularly preferably 60 to 100 nm. The particle size of the secondary particles can be measured by using a centrifugal precipitation method capable of measuring particle sizes of 0.01 μm or more.

To improve the dispersibility of polishing particles, it is also possible to further mix a dispersant such as a surfactant in a polishing slurry, in addition to colloidally dispersing the polishing particles in a solvent.

The viscosity of the polishing slurry is preferably 1 to 10 cp. If the viscosity is low, it becomes difficult to evenly disperse silicon nitride particles, i.e., polishing particles, in a solvent. When polishing particles are evenly dispersed in a solvent, the planarity of the polishing surface can be easily improved. If the viscosity is too high, the mechanical polishing properties become strong. When the mechanical polishing properties become too strong, the warpage of a wafer or the uniformity of the thickness of a deposited film has a large effect on the planarity after CMP.

The polishing temperature is preferably 20 to 70° C. This is so because if the temperature is too high, the chemical action becomes too strong.

In this first embodiment, the polishing conditions are that the rotating speed of the polishing disc 24 is 100 rpm, the rotating speed of the wafer carrier 31 is 100 rpm, the down force applied to the wafer carrier 31 is 400 g/cm$^2$, and the temperature of the polishing disc 24 is 25 to 30° C. The polishing slurry used consists of nitric acid as a solvent and silicon nitride particles as polishing particles and has a viscosity of 2 cp. This polishing slurry was supplied to the polishing pad at a flow rate of 300 cc/min to perform CMP on a 6' wafer (silicon substrate 1).

FIG. 3G shows the section after the polishing.

As shown in FIG. 3G, when the CVD-oxide film 6 is subjected to CMP by using the polishing slurry containing the silicon nitride particles, a processed shape having a small "dishing" and a high local planarization is obtained.

Subsequently, the nitride film 2 is etched away as shown in FIG. 3H.

In FIG. 3I, finish polishing is so performed that the surface of the silicon substrate 1 is flush with the surface of the CVD-oxide film 6. This completes trench isolation having a good processed shape with almost no "dishing" on the silicon substrate 1 and the CVD-oxide film 6 buried in the trenches 5.

FIG. 4 shows the results of experiments comparing the polishing rates, the selection rates, and the planarities of the polishing surfaces obtained by different polishing particles. Note that the polishing conditions of the comparative experiments are the same as the conditions explained with reference to FIG. 3G.

As shown in FIG. 4, a silicon dioxide film is polished by using a polishing slurry (IV) containing silicon nitride ($Si_3N_4$) particles. The polishing rate is 700 to 1000 nm/min. This polishing rate compares to or exceeds a conventionally highest polishing rate of 500 to 800 nm/min of a polishing slurry (I) containing cerium oxide (CeO) particles, and is highest among other comparative examples.

Also, a silicon dioxide film is polished with the polishing slurry (IV) by using a silicon nitride film as a stopper film. The selection rate ($SiO_2/Si_3N_4$) is 10 to 20. This selection rate far exceeds a conventionally maximum selection rate of 2 to 3 of a polishing slurry (II) containing fumed silica (fumed $SiO_2$), and is maximum among other comparative examples.

Furthermore, a silicon dioxide film is polished with the polishing slurry (IV) by using a silicon nitride film as a stopper film. The planarity of the polished surface is 2 to 5%. This planarity is better than a conventionally most accurate planarity of 10% of a polishing slurry (III) containing alumina ($Al_2O_3$) particles, and is most accurate among other comparative examples.

In the first embodiment as described above, it is possible by using the polishing slurry (IV) containing silicon nitride particles to simultaneously achieve high-speed polishing, a high selection rate with respect to the stopper film, and a highly accurate planarity.

To maintain the selection rate with respect to the stopper film and the planarity on the respective high levels, it is preferable to form the stopper film by using the same material, silicon nitride ($Si_3N_4$), as the polishing particles of the polishing slurry (IV) as in the first embodiment.

As the second embodiment, steps of burying trenches with polysilicon will be described below. These steps can be used to form, e.g., a memory cell of a DRAM.

FIGS. 5A to 5M are sectional views showing the steps of burying trenches with polysilicon in the order of steps.

As shown in FIG. 5A, the surface of a silicon substrate 1 is thermally oxidized to form a buffer oxide film ($SiO_2$) 8 about 10 to 50 nm thick.

In FIG. 5B, silicon nitride ($Si_3N_4$) is deposited on the buffer oxide film 8 to form a 70-nm thick nitride film 2. This nitride film 2 serves as a polishing stopper film and an oxidation barrier film when LOCOS is performed.

In FIG. 5C, silicon dioxide ($SiO_2$) is deposited on the nitride film 2 to form a CVD-oxide film 3. This CVD-oxide film 3 serves as a mask when trenches are formed.

In FIG. 5D, the CVD-oxide film 3 is coated with a photoresist to form a photoresist layer 9. Subsequently, windows corresponding to a trench formation pattern are formed in the photoresist layer 9 by photolithography.

In FIG. 5E, the CVD-oxide film 3, the nitride film 2, and the buffer oxide film 8 are etched by RIE by using the photoresist layer 9 as a mask, thereby exposing the surface of the silicon substrate 1. Thereafter, the photoresist layer 9 is removed.

In FIG. 5F, the CVD-oxide film 3 and the silicon substrate 1 are etched by RIE. As a consequence, trenches 10 are formed in the silicon substrate 1 due to the difference between the etching rates of the CVD-oxide film 3 and the silicon substrate 1. A damage layer formed by RIE on the silicon substrate 1 exposed to the trenches 10 and reaction products formed by RIE are removed. This is done by wet processing (wet etching). Subsequently, the surface of the silicon substrate 1 exposed inside the trenches 10 is thermally oxidized to form an oxide film ($SiO_2$) 11.

Figure 5G:
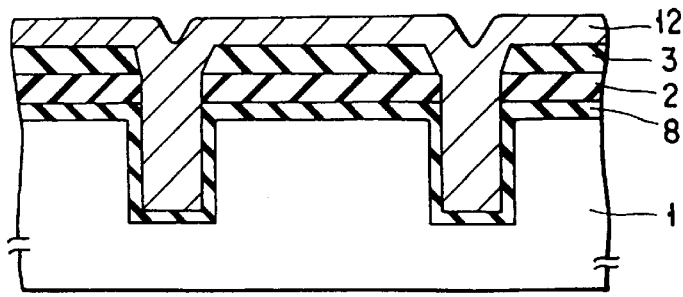

In FIG. 5G, silicon (Si) is deposited on the structure shown in FIG. 5F by using LPCVD, forming a polysilicon film 12. This polysilicon film 12 buries the trenches 10 and at the same time covers the surface of the silicon substrate 1 on which the trenches 10 are formed.

Figure 5H:
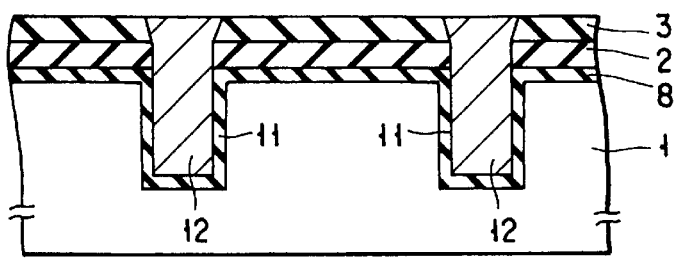

In FIG. 5H, the polishing apparatus shown in FIG. 2 is used to perform CMP for the polishing film 12 by using the CVD-oxide film 3 as a stopper film, thereby planarizing the surface of the structure shown in FIG. 5G (the first CMP step). This first CMP step is performed by using a polishing slurry, analogous to the polishing slurry explained in the first embodiment, which is prepared by dispersing silicon nitride particles as polishing particles in nitric acid as a solvent. Consequently, dishing formed on the exposed surface of the polysilicon film 12 can be decreased.

Figure 5I:
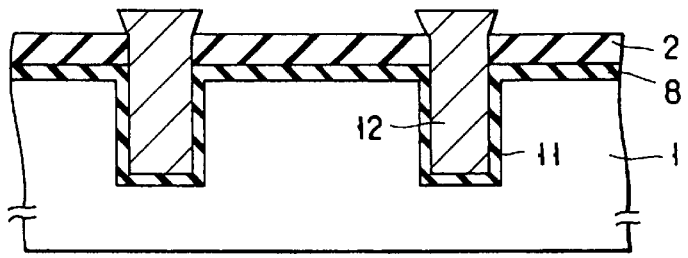

In FIG. 5I, the CVD-oxide film 3 is etched away by using an etching solution containing hydrofluoric acid (HF). In the structure from which the CVD-oxide film 3 is thus removed, the end portions of the polysilicon film 12 protrude from the surface of the nitride film 2.

Figure 5J:
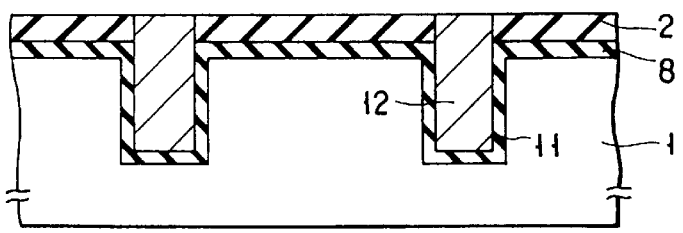

In FIG. 5J, the polishing apparatus shown in FIG. 2 is used to perform CMP for the polysilicon film 12 by using the nitride film 2 as a stopper film, thereby planarizing the surface of the structure shown in FIG. 5I (the second CMP step). In this second CMP step, the same polishing slurry as used in the first step is used. Consequently, dishing formed on the exposed surface of the polysilicon film 12 is decreased. Also, the edges of the nitride film 2 are abraded little.

Figure 5K:
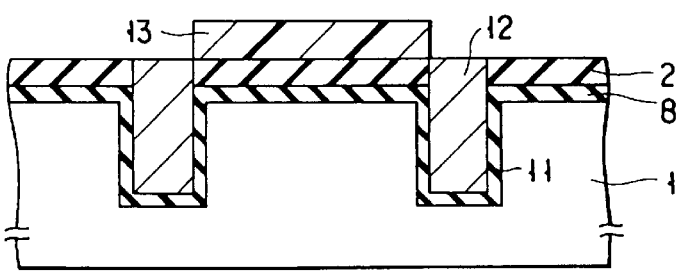

In FIG. 5K, the structure shown in FIG. 5J is coated with a photoresist to form a photoresist layer 13. A portion of the photoresist layer 13 which covers a prospective element isolation region is removed by photolithography, leaving only a portion of the photoresist layer 13 which covers a prospective element region.

Figure 5L:
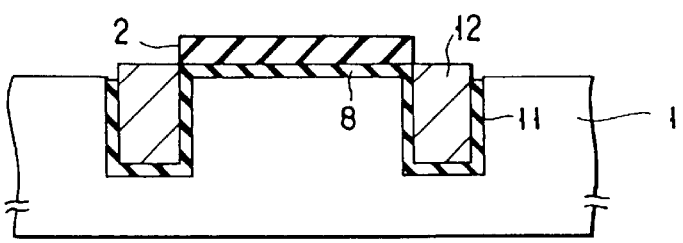

In FIG. 5L, the surface of the silicon substrate 1 is exposed by removing the nitride film 2 and the buffer oxide film 8 by using the photoresist layer 13 as a mask. Thereafter, the photoresist layer 13 is removed.

In FIG. 5M, the exposed surface of the silicon substrate 1 and the surface of the polysilicon film 12 are thermally oxidized by using the nitride film 2 as an oxidation barrier film, thereby forming a field oxide film ($SiO_2$) 14 on the surface of the structure shown in FIG. 5L (the LOCOS step). In this LOCOS step, a bird's beak is formed along the edges of the nitride film 2. However, this bird's beak is small because the abrasion amount of the edges of the nitride film 2 is small. A bird's beak reduces the area of the element region and has an influence on the characteristics of a semiconductor device.

FIGS. 6A to 6D illustrate an example in which the fabrication method according to the second embodiment is performed by using a conventional polishing slurry. In FIGS. 6A to 6D, the same reference numerals as in FIGS. 5A to 5M denote the same parts.

FIG. 6A corresponds to the step shown in FIG. 5J.

As shown in FIG. 6A, the polishing apparatus shown in FIG. 2 is used to perform CMP for a polysilicon film 12 by using a nitride film 2 as a stopper film, thereby planarizing the surface of the structure shown in FIG. 5I. This CMP is done by using a polishing slurry prepared by dispersing silica particles as polishing particles in nitric acid as a solvent. Consequently, dishing 7 is formed on the exposed surface of the polysilicon film 12. Also, the edges of the nitride film 2 are scraped off and abraded.

FIG. 6B corresponds to the step shown in FIG. 5K.

FIG. 6C corresponds to the step shown in FIG. 5L.

FIG. 6D corresponds to the step shown in FIG. 5M.

As shown in FIG. 6D, the exposed surface of a silicon substrate 1 and the surface of the polysilicon film 12 are thermally oxidized by using the nitride film 2 as an oxidation barrier film, thereby forming a field oxide film ($SiO_2$) 14 on the surface of the structure shown in FIG. 6C. Since the edges of the nitride film 2 are largely abraded, a bird's beak largely extends in the interface between the nitride film 2 and the silicon substrate 1. This is because the abraded edges of the nitride film 2 easily warp. The bird's beak extending toward the element region reduces the area of the element region. In a certain MOSFET, the width of the element region determines the gate width of the MOSFET. In a MOSFET of this sort, the gate width is narrowed by narrowing of the width of the element region. The gate width of a MOSFET determines the drivability of the MOSFET. Accordingly, if the gate width greatly deviates from the design value, the characteristics of the semiconductor device are affected.

In contrast, in the fabrication method according to the second embodiment, the edges of the nitride film 2 are abraded little and hence do not easily warp. Accordingly, the bird's beak does not easily extend and the gate width does not largely deviate from the design value. Consequently, the characteristics of the semiconductor device are not easily affected.

Also, in the fabrication method according to the second embodiment, the conversion difference between the LOCOS patterns is small because the bird's beak is small. Accordingly, the method is suitable for fine element region patterns.

As the third embodiment, steps of forming an interconnecting pattern by trenches, burying the trenches with a conductor, and forming interconnecting lines will be described below. This interconnecting line formation method is used for high-packing-density semiconductor devices and generally called damascene process.

FIGS. 7A to 7E are sectional views showing the steps of forming interconnecting lines in order.

Figure 7A:
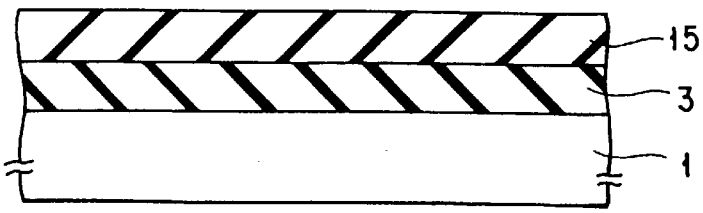
FIGS. 7A to 7E are sectional views showing steps of forming interconnecting lines according to the third embodiment of the present invention.

As shown in FIG. 7A, a CVD-oxide film ($SiO_2$) 3 and a plasma oxide film ($SiO_2$) 15 formed by plasma CVD are formed in this order on a silicon substrate 1. The CVD-oxide film 3 and the plasma oxide film 15 are insulating interlayers.

Figure 7B:
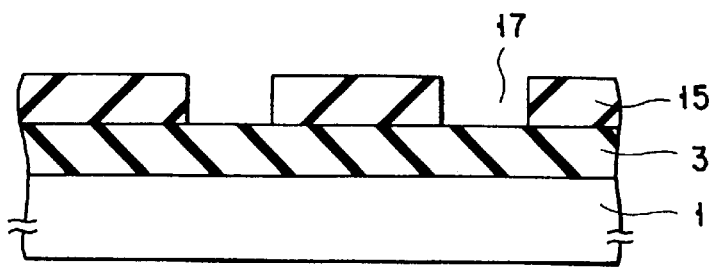

In FIG. 7B, the plasma oxide film 15 is so patterned as to form trenches 17 corresponding to an interconnecting pattern.

Figure 7C:
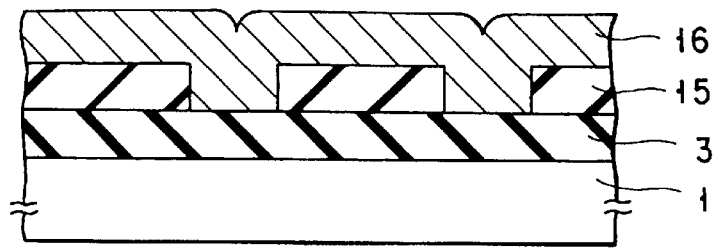

In FIG. 7C, copper (Cu) is deposited on the structure shown in FIG. 7B to form a copper film 16. This copper film 16 buries the trenches 17 and at the same time covers the surface of the plasma oxide film 15 on which the trenches 17 are formed.

Figure 7D:
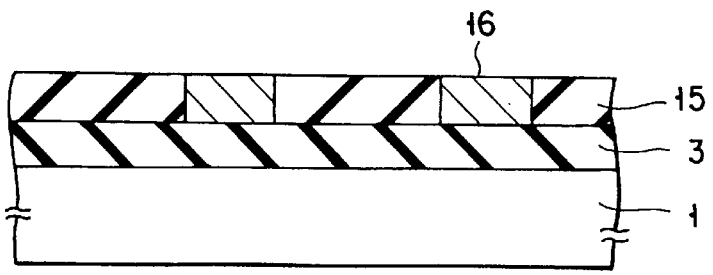

In FIG. 7D, the polishing apparatus shown in FIG. 2 is used to perform CMP for the copper film 16 by using the plasma oxide film 15 as a stopper film, thereby planarizing the surface of the structure shown in FIG. 7C. This CMP step is done by using a polishing slurry, similar to the polishing slurry explained in the first embodiment, which is prepared by dispersing silicon nitride particles as polishing particles in nitric acid as a solvent. As a consequence, dishing formed on the exposed surface of the copper film 16 is decreased. By this CMP, copper is buried only in the trenches 17 to complete buried interconnecting lines in the first layer.

Figure 7E:
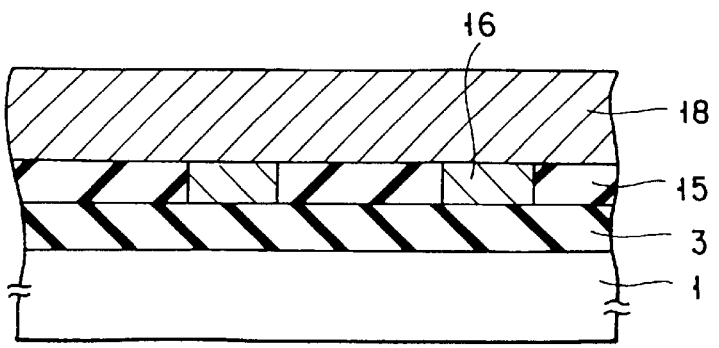

Subsequently, as shown in FIG. 7E, silicon dioxide ($SiO_2$) is deposited on the structure shown in FIG. 7D by using plasma CVD, forming a plasma oxide film 18. Since the surface of the structure shown in FIG. 7D is accurately planarized, the plasma oxide film 18 is easily formed.

Also, forming buried interconnecting lines using the polishing slurry according to the present invention facilitates the formation of buried interconnecting lines in the second and third layers (not shown).

The secondary particle size dependence of the polishing rate will be described below.

Figure 8:
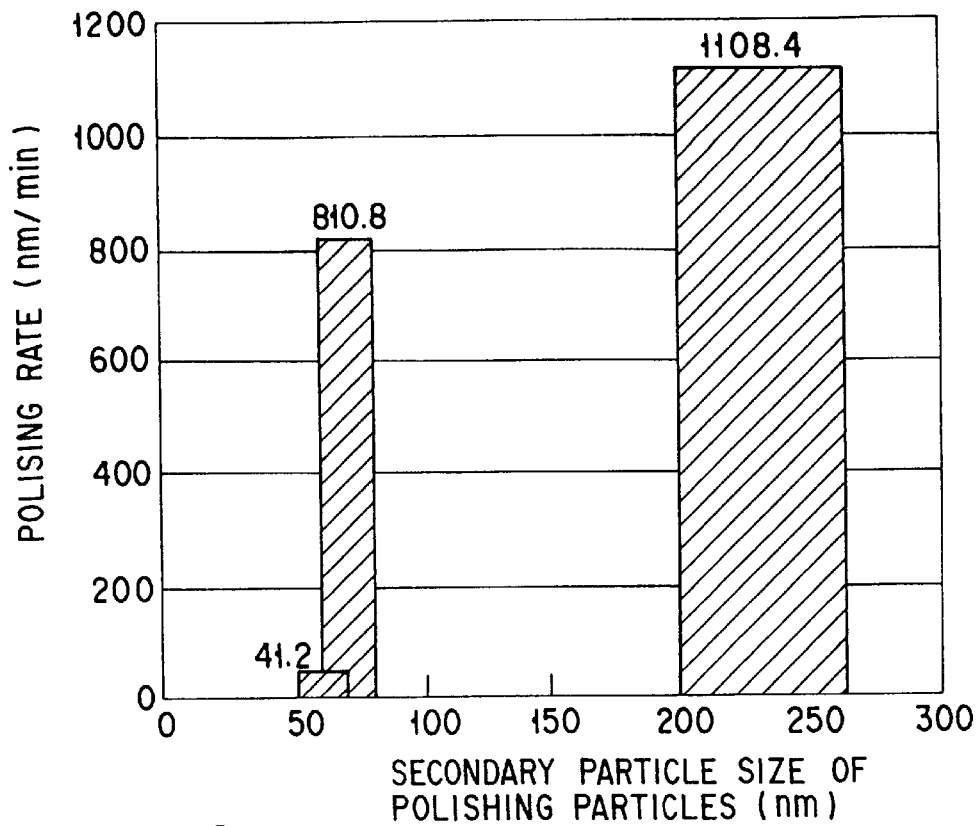
FIG. 8 is a graph showing the relationship between the secondary particle size of polishing particles and the polishing rate in a polishing slurry according to the present invention.

FIG. 8 is a graph showing the relationship between the secondary particle size of polishing particles and the polishing rate. This secondary particle size dependence of the polishing rate was obtained by polishing polysilicon with a polishing slurry prepared by dispersing silicon nitride particles as polishing particles in nitric acid as a solvent.

Referring to FIG. 8, the ordinate indicates the polishing rate and the abscissa indicates the secondary particle size.

As shown in FIG. 8, when the secondary particle size is about 50 nm, the polishing rate is 41.2 nm/min. However, when the secondary particle size exceeds about 60 nm, the polishing rate greatly increases to 810.8 nm/min. When the secondary particle size is about 200 to 260 nm, the polishing rate is 1108.4 nm/min.

As described above, a polishing slurry containing silicon nitride polishing particles has a tendency to critically increase its polishing rate when the secondary particle size of the polishing particles exceeds about 60 nm.

When the particle size of polishing particles is small, polishing proceeds mainly due to the action of chemical polishing. As the particle size of polishing particles increases, the action of mechanical polishing becomes strong in polishing. It is estimated that the action of mechanical polishing is particularly significant in a polishing slurry containing silicon nitride polishing particles when the secondary particle size is about 60 nm.

The secondary particle size is preferably as large as possible. However, if the secondary particle size is too large, a number of flaws may be formed on the polished surface. If a conductor such as a metal enters these flaws, this may cause a short circuit. Therefore, the number of flaws is preferably as small as possible. For this reason, it is preferable that the secondary particle size do not exceed 300 nm. In addition, the particle size of secondary particles is preferably minimized as long as the polishing rate does not decrease. From these points of view, the particle size of secondary particles is particularly preferably about 60 to 100 nm.

As a solvent used in the polishing slurry of the present invention, it is possible to use an emulsifying agent, water, a surfactant, fats and oils, an adhesive, and ionized water, in addition to nitric acid. Also, an acidic solvent is primarily used as a solvent. One representative example is nitric acid. Examples of an alkaline solvent are ammonia, amines such as piperazine, and inorganic alkalis such as potassium hydroxide and sodium hydroxide. Any of these alkaline solvents can also be used as a solvent.

It is also possible to prepare a diluted polishing slurry by adding a dispersant, e.g., ionized water, to the polishing slurry according to the present invention. When a polishing slurry like this is used, not only the polishing slurry contributes to polishing but there is also an auxiliary polishing action by the dispersant. A solvent of a polishing slurry also has a dispersion effect.

Examples of the dispersant are an emulsifying agent, water, a surfactant, fats and oils, an adhesive, and ionized water (alkali ionized water and acidic ionized water).

If a polishing slurry added with a dispersant is left to stand, however, the dispersant sometimes reacts with particularly the solvent of the polishing slurry to deteriorate the polishing slurry. To prevent this deterioration of a polishing slurry, it is possible to simultaneously add a polishing slurry and a dispersant to the process point of a polishing pad when CMP is performed. Especially when a dispersant is alkali ionized water, it is preferable to produce alkali ionized water and at the same time supply the produced water together with a polishing slurry to the process point of a polishing pad. This is so because alkali ionized water cannot be stored for long time periods.

Figure 9:
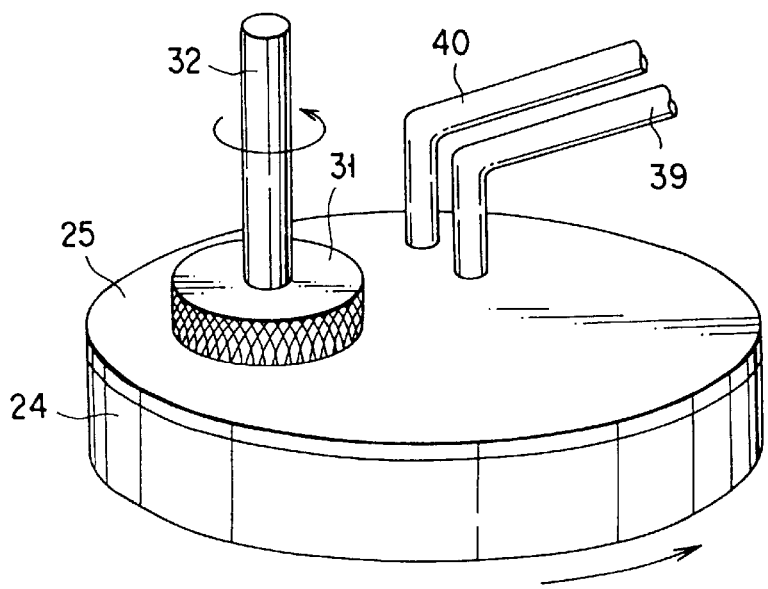
FIG. 9 is a perspective view of another polishing apparatus used in CMP according to the present invention.

FIG. 9 is an enlarged perspective view of an essential part of a CMP apparatus (Polisher) according to a first embodiment of the invention, showing a wafer carrier 31, a polishing disc 24 and its peripheral elements. This CMP apparatus has basically the same structure as the FIG. 2 apparatus. In the CMP apparatus of the fourth embodiment, the polishing disk 24 has a support unit (not shown) provided at a lower portion thereof, and a driving shaft (not shown) is provided at a center portion of the polishing disk 24. The polishing disc 24 rotates together with the driving shaft when a motor (not shown) rotates. A polishing pad 25 formed of plolyurethane foam or plolyurethane nonwoven fabric is attached to the upper surface of the polishing disc 24. A semiconductor wafer (not shown) is held by the wafer carrier 31 by a vacuum force, etc. such that it is opposed to the polishing pad 24. A driving shaft 32 is provided on a center portion of the wafer carrier 31 for rotating the carrier 33 in accordance with the rotation of a motor (not shown). Further, the semiconductor wafer held by the wafer carrier 31 is pressed against the polishing pad 24 and released therefrom in accordance with the movement of the driving shaft 32.

In the invention, at the time of polishing a semiconductor wafer, a polishing slurry which contains silicon nitride ($Si_3N_4$) particles is supplied from a polishing tank through a polishing-slurry supply pipe 39 to the polishing pad 25, and at the same time ionized water is supplied from an ionized-water supply pipe 40 to the polishing pad 25. To this end, the polishing-slurry supply pipe 39 and the ionized-water supply pipe 40 have their nozzles located above the polishing pad 25 and in the vicinity of the wafer carrier 31 which holds the semiconductor wafer. The polishing slurry and ionized water are supplied to the working area of the polishing pad 25 and mixed with each other by means of the supply pipes 39 and 40. The supply pipes 39 and 40 are movable over the polishing pad 24.

At the time of polishing, the semiconductor wafer is pressed against the polishing pad 25 on the polishing disc 24 with a down force of 50 to 500 g/cm while the pad 25 and the disc 24 rotate at 20 to 200 rpm.

Ionized water supplied from the ionized-water supply pipe 40 can be classified into alkaline ionized water and acidic ionized water. Ionized water of a desired pH is created by electrolyzing, at a low voltage, deionized water which contains no electrolyte, i.e. no metal impurity, in an electrolytic bath with a solid electrolyte contained therein. Where alkaline ionized water is used and the polishing rate is changed during polishing, the rate can be increased in a stable manner by increasing the pH value of alkaline ionized water, and can be reduced in a stable manner by reducing the pH value of alkaline ionized water. On the other hand, in the case of using acidic ionized water, the polishing rate can be increased in a stable manner by reducing the pH value of acidic ionized water, and can be reduced in a stable manner by increasing the pH value of acidic ionized water.

Figure 10:
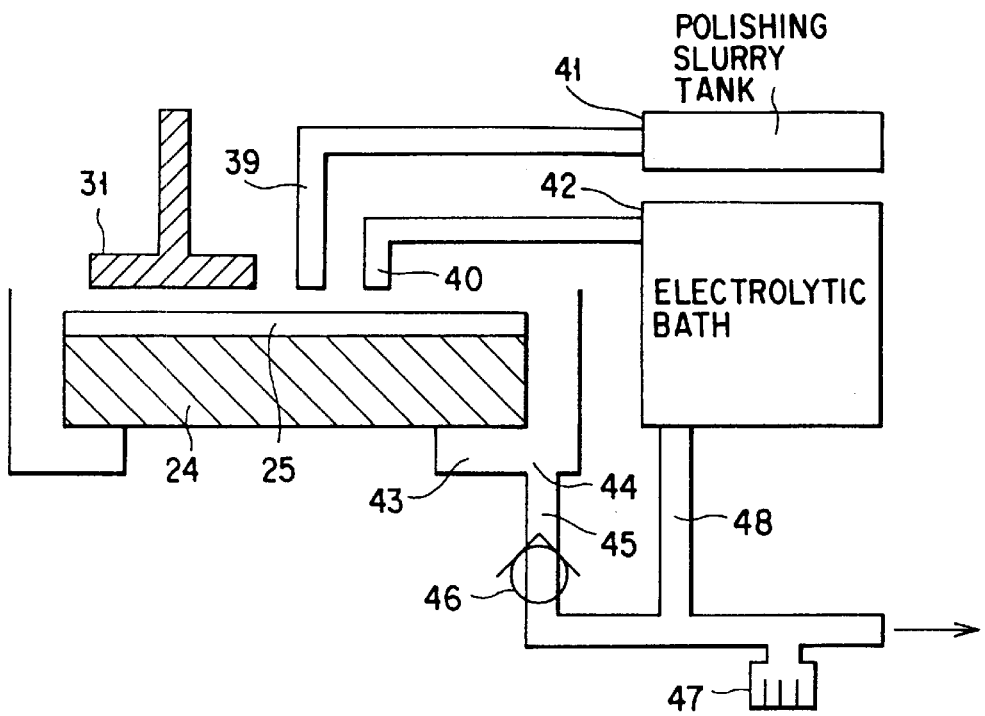
FIG. 10 is a block diagram of the other polishing apparatus used in CMP according to the present invention.

FIG. 10 is a sectional view, showing a CMP apparatus according to a fifth embodiment of the invention, and specifically showing a wafer carrier, a polishing disc, a waste water mechanism and an electrolytic bath for supplying ionized water. This CMP apparatus has the same basic structure as that shown in FIG. 2. A polishing pad 25 formed of plolyurethane nonwoven fabric, etc. for polishing a semiconductor wafer is attached to the upper surface of a polishing disc 24. A semiconductor wafer (not shown) is held by a wafer carrier 31 by a vacuum or water, etc. such that it is opposed to the polishing pad 25. A driving shaft 32 is provided on a center portion of the wafer carrier 31 for rotating the carrier 31 in accordance with the rotation of a motor (not shown). Further, the semiconductor wafer held by the wafer carrier 31 is pressed against the polishing pad 25 and released therefrom in accordance with the movement of the driving shaft 32.

At the time of polishing the semiconductor wafer, a polishing slurry containing polishing particles such as silicon nitride particles is supplied from a polishing slurry tank 41 through a polishing-slurry supply pipe 39 to the polishing pad 25, and at the same time ionized water is supplied from an ionized-water supply pipe 40 to the polishing pad 25. To this end, the polishing-slurry supply pipe 34 and the ionized-water supply pipe 40 have their nozzles located above the polishing pad 25 and in the vicinity of the wafer carrier 31 which holds the semiconductor wafer. The supply pipes 37 and 40 are disposed to be movable over the polishing pad 25, thereby supplying the polishing slurry and ionized water to the working area of the polishing pad 25 and permitting them to be mixed with each other.

The rotary polishing disc 24 is received in an envelope 43 so as to prevent the wasted polishing slurry and ionized water having been used for polishing from scattering to the outside. An exhaust port 44 is formed in the bottom of the envelope 43 for exhausting the wasted water. A wasted water pipe 45 is connected to the exhaust port 44. A one-way valve 46 is voluntarily provided across the waste pipe 45 for preventing reverse flow of the wasted water. Further, a sediment bath 47 is voluntarily provided for separating polishing particles having been used for polishing from the wasted water.

The polishing-slurry supply pipe 39 is connected to the polishing slurry tank 41, while the ionized-water supply pipe 40 is connected to an electrolytic bath 42. An ionized-water exhaust pipe 48 is connected to the wasted water pipe 55 lead from the envelope 43. A one-way valve may be provided across the ionized-water exhaust pipe 48, too.

The above-described pipe structure enables the ionized water exhausted from the electrolytic bath 42 to be mixed with the ionized water contained in the wasted water, thereby neutralizing them. Thus, the wasted pipe 45 and the ionized-water exhaust pipe 48 connected thereto constitute a neutralization mechanism. In general, when in the electrolytic bath, alkaline (or acidic) ionized water is created, acidic (or alkaline) ionized water of the same amount is also created. Therefore, in the case of performing polishing using alkaline ionized water, acidic ionized water created simultaneously and not necessary for polishing is collected through the ionized-water exhaust pipe 48 to the wasted-water pipe 55 to neutralize the wasted water created during polishing.

Figure 11:
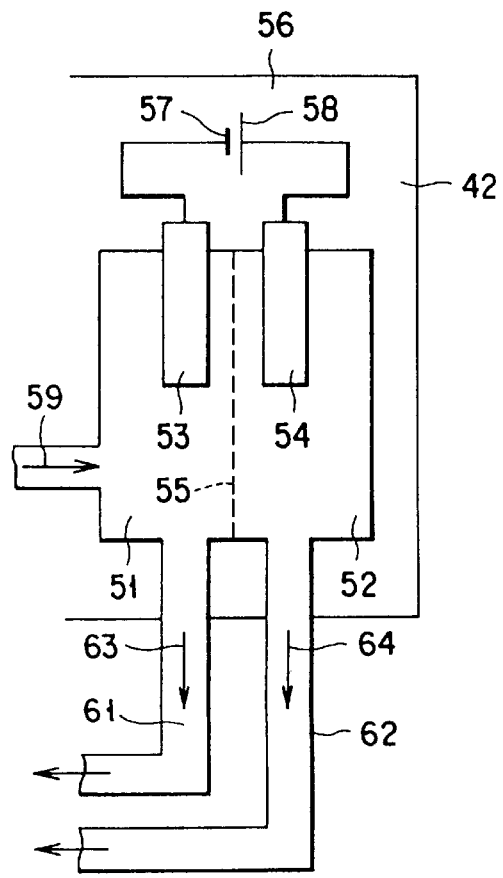
FIG. 11 is a block diagram of an electrolytic bath of the other polishing apparatus.

FIG. 11 is a sectional view of a CMP apparatus according to a sixth embodiment of the invention, showing an electrolytic bath. As is shown in FIG. 11, an electrolytic bath 42 has a cathode chamber 51 and an anode chamber 52. The cathode chamber 51 contains a cathode electrode 53, while the anode chamber 52 contains an anode electrode 54. These electrodes 53 and 54 are formed of platina or titanium. The cathode and anode chambers 51 and 52 are partitioned by a porous barrier membrane 55 for efficiently separating negative-ionized water 63 created in the cathode chamber 51, from positive-ionized water 64 created in the anode chamber 52. The cathode electrode 53 in the electrolytic bath 42 is connected to the negative electrode 57 of a battery 56, and the anode electrode 54 to the positive electrode 58 of the battery 56.

In the electrolytic bath 42, a diluent electrolyte solution 54 with a supporting electrolyte (e.g. ammonium chloride) contained therein is mixed with deionized water, and a power voltage is applied thereto from the battery 56, thereby electrolyzing the deionized water. Negative-ionized water 63 created on the side of the cathode electrode 53 as a result of electrolyzation is alkaline ionized water, while positive-ionized water 64 created on the side of the anode electrode 54 is acidic ionized water. Moreover, if deionized water is electrolyzed in the bath 42 using oxalic acid as the supporting electrolyte, both negative-ionized water created on the side of the cathode and positive-ionized water created on the side of the anode exhibit acidic properties. The negative-ionized water 63 in the cathode chamber 51 is supplied to the outside through a negative-ionized water supply pipe 61, and the positive-ionized water in the anode chamber 52 is supplied to the outside through a positive-ionized water supply pipe 62.

Since alkaline ionized water is usually created in the cathode chamber 51, the negative-ionized water supply pipe 61 connected to the electrolytic bath 42 is used, in the sixth embodiment, as the ionized-water supply pipe 40 for supplying alkaline ionized water to the polishing pad 25, when polishing is performed using alkaline ionized water. In this case, acidic ionized water created in the anode chamber 52 is not necessary and hence exhausted. Accordingly, the positive-ionized water supply pipe 62 is used as the ionized water exhaust pipe 48 for exhausting ionized water, and connected to the wasted water pipe 45. On the other hand, if polishing is performed using acidic ionized water, the positive-ionized water supply pipe 62 connected to the electrolytic bath 42 is used as the ionized-water supply pipe 40 for supplying acidic ionized water to the polishing pad 25. In this case, alkaline ionized water created in the cathode chamber 51 is not necessary and hence exhausted. Thus, the negative-ionized water supply pipe 61 is used as the ionized water exhaust pipe 48 for exhausting ionized water, and connected to the wasted water pipe 45. (See FIG. 10)

Ionized water can be classified into alkaline ionized water and acidic ionized water. Ionized water of a desired pH is created by electrolyzing, at a low voltage, deionized water which contains no electrolyte, i.e. no metal impurity, in an electrolytic bath with a solid electrolyte contained therein. Where in the case of using alkaline ionized water, the polishing rate is changed during polishing, it can be increased in a stable manner by increasing the pH value of alkaline ionized water, and can be reduced in a stable manner by reducing the pH value of alkaline ionized water. On the other hand, in the case of using acidic ionized water, the polishing rate can be increased in a stable manner by reducing the pH value of acidic ionized water, and can be reduced in a stable manner by increasing the pH value of acidic ionized water.

Whether alkaline ionized water or acidic ionized water is used depends upon the kind of a film deposited on a semiconductor wafer.

Ionized water can electrically stabilize the surface of the film deposited on the wafer obtained after polishing. Acidic ionized water is suitable for a deposit film made of a metal with a high melting point, such as Al, Cu, W, etc. Such a deposit film has its surface oxidized by acidic ionized water after polishing, with the result that the potential of the surface is stabilized.

Alkaline ionized water or acidic water is suitable for a deposit film made of silicon oxide ($SiO_2$), silicon nitride ($Si_3N_4$), polysilicon or monocrystalline silicon. Alkaline ionized water can electrically stabilize the surface of such a deposit film. Alkaline ionized water should be used case where a $SiO_2$ film is polished, and case where a polysilicon film is polished. On the other hand, acidic ionized water should be used case where a Cu film is polished.

Conditions such as the polishing rate, the degree of stabilization of a deposit film, etc. depend upon the pH value of ionized water. Therefore, adjustment of the pH value of ionized water is very important to set optimal polishing conditions. Since the pH value of ionized water depends upon its temperature. It can be accurately adjusted by controlling the temperature of ionized water. The pH value of acidic ionized water increases as its temperature increases, whereas that of alkaline ionized water reduces as its temperature increases. Further, the rate of change in pH is higher in alkaline ionized water than in acidic ionized water.

Conventionally, polishing slurries are roughly classified into two categories: one is an oxide-based polishing slurry and the other is a metal-based polishing slurry. The oxide-based polishing slurry is represented by a polishing slurry containing silica polishing particles. The metal-based polishing slurry is represented by a polishing slurry containing alumina polishing particles. The oxide-based polishing slurry is used in polishing of silicon and silicon oxide. The metal-based polishing slurry is used in polishing of tungsten, copper, and aluminum. That is, polishing slurries are selected in accordance with the substances to be polished in the fabrication of semiconductor devices.

A polishing slurry containing silicon nitride polishing particles, however, can singly polish all of silicon, silicide, silicon oxide, silicon nitride, tungsten, copper, gold, and aluminum.

In addition, a polishing slurry containing silicon nitride polishing particles can polish silicides such as glass and therefore can be used in polishing of, e.g., liquid-crystal screens and lenses. This remarkably widens the range of uses of this polishing slurry.

Furthermore, an equivalent effect can be obtained by using silicon carbide or graphite, particularly carbon graphite, instead of silicon nitride, as polishing particles.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing method of polishing a material of a semiconductor device, wherein a stopper film for suppressing polishing is formed below said material to be polished, comprising the steps of: polishing the material to be polished using a polishing slurry prepared by dispersing polishing particles formed from the same material as that used to form said stopper film and comprising silicon nitride, and suppressing polishing with said stopper film.

2. A method according to claim 1, wherein said material to be polished is a thin film constituting a semiconductor device.

3. A method according to claim 2, wherein said thin film contains one member selected from the group consisting of silicon, silicon oxide, a silicide, copper, aluminum, gold, and tungsten.

4. A method of planarizing a structure contained in a semiconductor device, comprising the steps of:

forming a structure contained in a semiconductor device and a stopper film on a trench formation surface of said structure;

etching selected portions of said stopper film and said structure to form a trench in said trench formation surface;

forming a burying material on said trench formation surface so that said burying material buries an interior of said trench and covers said trench formation surface; and polishing said burying material until said stopper film is exposed by using a polishing pad and a polishing slurry supplied to said polishing pad, said polishing slurry containing an acidic solvent and polishing particles colloidally dispersed in said solvent and comprising silicon nitride, thereby burying said trench with said burying material and planarizing said trench formation surface, wherein said stopper film consists of the same material as said polishing particles.

5. A polishing method of polishing a material to be polished, wherein the material to be polished is polished by using a polishing slurry containing acidic solvent and polishing particles colloidally dispersed in said solvent and comprising silicon nitride, wherein said material to be polished is a thin film constituting a semiconductor device, and wherein said thin film contains one member selected from the group consisting of silicon, silicon oxide, a silicide, copper, aluminum, gold, and tungsten, and wherein a stopper film for suppressing polishing is formed below said material to be polished using the same material as said polishing particles.

6. A polishing method of polishing a material to be polished, wherein the material to be polished is polished by using a polishing slurry containing acidic solvent and polishing particles colloidally dispersed in said solvent and comprising silicon nitride, wherein a primary particle size of said polishing particles is 0.01 to 1000 nm, and wherein a stopper film for suppressing polishing is formed below said material to be polished by using the same material as said polishing particles.

7. A method of planarizing a structure contained in a semiconductor device, comprising the steps of:

forming a structure contained in a semiconductor device and a stopper film on a trench formation surface of said structure;

etching selected portions of said stopper film and said structure to form a trench in said trench formation surface;

forming a burying material on said trench formation surface so that said burying material buries an interior of said trench and covers said trench formation surface; and polishing said burying material until said stopper film is exposed by using a polishing pad and a polishing slurry supplied to said polishing pad, said polishing slurry containing acidic solvent and polishing particles colloidally dispersed in said solvent and comprising silicon nitride, a primary particle size of said polishing particles being 0.01 to 1000 nm, thereby burying said trench with said burying material and planarizing said trench formation surface, wherein said stopper film consists of the same material as said polishing particles.

* * * * *